(12) United States Patent
Harris

(10) Patent No.: US 7,324,315 B2
(45) Date of Patent: Jan. 29, 2008

(54) PROTECTION DEVICE

(75) Inventor: Richard Allen Harris, Kawana Downs (AU)

(73) Assignee: Fultec Pty Ltd (AU)

( * ) Notice: Subject to any disclaimer, the term of this patent is extended or adjusted under 35 U.S.C. 154(b) by 407 days.

(21) Appl. No.: 10/504,503

(22) PCT Filed: Feb. 12, 2003

(86) PCT No.: PCT/AU03/00175

§ 371 (c)(1),
(2), (4) Date: Aug. 12, 2004

(87) PCT Pub. No.: WO03/069753

PCT Pub. Date: Aug. 21, 2003

(65) Prior Publication Data

US 2005/0128669 A1     Jun. 16, 2005

(30) Foreign Application Priority Data

Feb. 12, 2002   (AU) ................................ PS0457

(51) Int. Cl.
*H02H 9/00*    (2006.01)
(52) U.S. Cl. ......................................... 361/58
(58) Field of Classification Search ................... 361/58
See application file for complete search history.

(56) References Cited

U.S. PATENT DOCUMENTS

| | | | |
|---|---|---|---|
| 3,603,811 A | | 9/1971 | Day |
| 4,533,970 A | | 8/1985 | Brown |
| 4,744,369 A | | 5/1988 | Kroll |
| 4,811,156 A | * | 3/1989 | Kroll ........................... 361/58 |
| 4,868,703 A | | 9/1989 | Borkowicz |
| 5,196,980 A | | 3/1993 | Carson |
| 5,729,418 A | | 3/1998 | Lei |
| 5,742,463 A | * | 4/1998 | Harris ......................... 361/88 |

\* cited by examiner

*Primary Examiner*—Ronald W. Leja
(74) *Attorney, Agent, or Firm*—Pitts & Brittian, P.C.

(57) ABSTRACT

A protection device is enclosed. The device has a first MOSFET (Q 10), a second MOSFET (Q 11) and a third JFET (Q 12) with their conductive paths in series with the JFET (Q 12) being located between the MOSFETS (Q 10, Q 11). The source of the first MOSFET (Q 10) is connected to the gate of the second MOSFET (Q 11) and the source of the second MOSFET (Q 11) is connected to the gate of the first MOSFET (Q 10). The MOSFETS (Q 10, Q 11) and JFET (Q 12) together form a variable resistance circuit block connectable between an input and an output The gate of the JFET (Q 12) being coupled to the input and the output by respective current sources.

21 Claims, 2 Drawing Sheets

PROTECTION DEVICE

The present application is a National Stage application of, and claims the benefit of, International Application No. PCT/AU03/00175, filed 12 Feb. 2003, and accordingly claims priority to Australian Patent Application Ser. No. PS 0457, filed on 12 Feb. 2002.

This invention relates to a protection device. In particular, the invention concerns a protection device which may function to prevent the flow of undesirable transients or isolate a load from undesirably high voltages or currents.

The device of the invention may be used as an alternative to a fuse. Fuses employing thermal or magnetic elements for effecting control of currents and voltages are known.

BACKGROUND ART

U.S. Pat. No. 5,742,463 proposes various active circuits which may function as a protection device and serve as an alternative to known fuses for inhibiting the transmission of transients to a load.

The practical embodiments disclosed in U.S. Pat. No. 5,742,463 employ depletion mode junction field effect transistors (JFETS) and utilize commutating diodes in those embodiments where the number of components has been minimised. U.S. Pat. No. 5,742,463 suggests that depletion mode metal oxide semi conductor field effect transistors (MOSFETS) may be used as alternatives to junction field effect transistors (JFETS).

The operation of the embodiment of U.S. Pat. No. 5,742,463 is such that once the JFETS that have their conduction paths in series are in the cut-off phase of their conduction characteristics in response to the present of a transient of a sufficient magnitude, those JFETS cannot return to their original conducting phase until the applied input returns to zero or near zero.

Thus, the embodiments of U.S. Pat. No. 5,742,463 were unsuitable for operation with inputs which were level shifted and where transients occurred and the input did not return to zero or near zero after the occurrence of the transient that caused the series connected transistors to assume their cut-off condition. In addition, U.S. Pat. No. 5,742,463 required the presence of commutating diodes.

SUMMARY OF THE INVENTION

It is an object of the present invention to provide an active protection device which may serve as an alternative to known types of fuses and at least minimises some of the disadvantage referred to above.

According to one aspect of the invention there is provided a protection device connectable between an input and a load or connectable in a circuit, the device having a variable resistance circuit block connectable between the input and the load or connectable in the circuit as a series element, the circuit block having a first depletion mode FET, a second depletion mode FET having a gate coupled to the first FET with a gate of the first FET being coupled to the second FET and a third depletion mode field effect transistor (FET) between the first and second FETS and having its conductive channel in series with conductive paths of the first and second FETS and said third FET for generating a negligible resistance when the current through the circuit block is below a threshold level and for generating a relatively high resistance when the current through the circuit block reaches a threshold level.

Preferably, the first and second FETS are high voltage depletion mode MOSFETS. Preferably the third FET is a depletion mode JFET. In one embodiment the MOSFETS are n-channel MOSFETS and the JFET is a pchannel JFET.

Preferably, the protection device includes a holding circuit connected between a first one and a second one of the transistors, the holding circuit provides a holding voltage for resetting the second transistor after the occurrence of a transient without the need for the input to return to zero or near zero. The holding circuit may include a depletion mode MOSFET with its conductive channel connected between the gate of the JFET and the input.

Preferably a current source, which in its simplest form is a resistor, is connected between the gate of the JFET and the input and also between the gate and the output.

BRIEF DESCRIPTION OF DRAWINGS

Particular preferred embodiments of the invention will now be described by way of example with reference to the drawings in which.

DETAILED DESCRIPTION OF THE PREFERRED EMBODIMENTS

Figure 1:
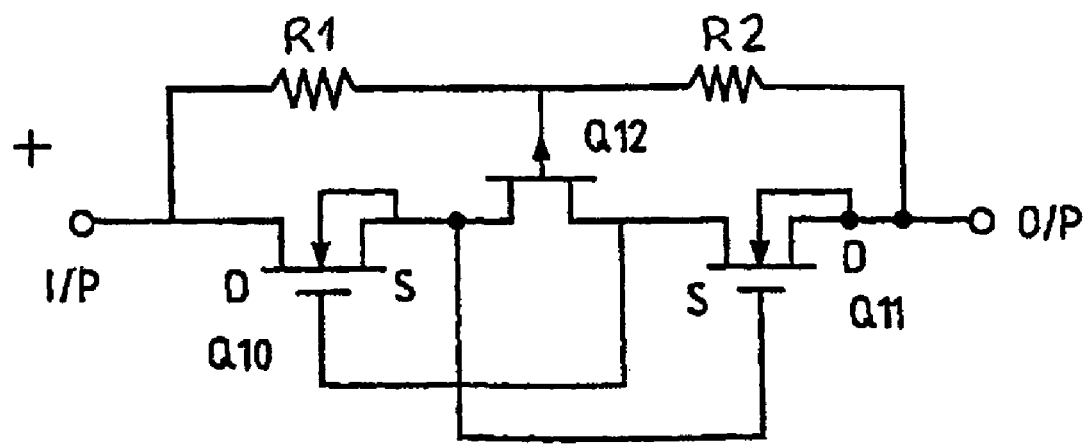
FIG. 1 is a circuit diagram of a protection device or transient blocking unit (TBU) according to a first embodiment of the invention.

FIG. 1 shows a TBU circuit suitable for bipolar operation. The depletion mode N channel MOSFETS Q10 and Q11 are in series with depletion mode P channel JFET Q12. With the input more positive than the output and where the input (or through) current is below a threshold current all three transistors Q10 to Q12 are conducting. When a current greater than the threshold current is applied through the TBU, MOSFET Q10 and JFET Q12 cease conducting for positive currents and MOSFET Q11 and JFET Q12 for negative currents and the input is isolated from the output. For the circuit to reset the input must return to zero or near zero. The commutating diodes of U.S. Pat. No. 5,742,463 may be eliminated when Q10 and Q11 are MOSFETs and Q12 is a JFET and a current source, which in its simplest form is a resistor, is used to connect the gate of Q12 to the drain of each of Q10 and Q11. In this figure, transistors Q10, Q12 and Q11 form a variable resistance circuit block and resistors R1 and R2 are current sources.

Figure 2:
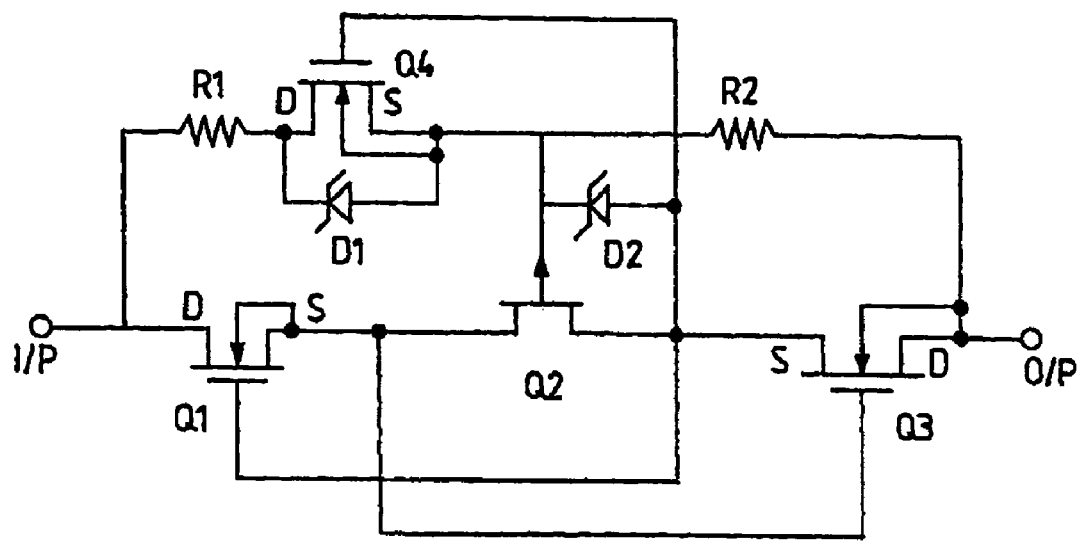
FIG. 2 is a circuit diagram of a protection device according to a second embodiment of the invention.

FIG. 2 shows a TBU circuit according to a second embodiment of the invention. The TBU of FIG. 2 has a combination of a N channel depletion mode MOSFET Q1 in series with a P channel depletion mode JFET Q2 and an N channel depletion mode MOSFET Q3.

The drain of Q1 is coupled to an input of the TBU and the drain of Q3 is coupled to an output of the TBU.

A further depletion mode N channel MOSFET Q4 has its drain coupled to the input of the TBU via resistor R1 and its source coupled to the output of the TBU via resistor R2. An avalanche diode D1 extends between the drain and source of Q4. The source of Q4 is coupled to the gate of Q2 and an avalanche diode D2 extends between the gate of Q2 and the gate of Q4. Transistors Q1, Q2 and Q3 form a variable resistance circuit block.

The circuit of FIG. 2 operates as follows:

When there is no over-current condition all of the FETS in the circuit are conducting and a small voltage drop is established across each of the series connected FETS Q1, Q2 and Q3 with the major voltage applied to the input being available at the output of the TBU. This is the normal untriggered state of the TBU and the circuit performs identically to that of the circuit of FIG. 1 until the threshold is reached.

In the event of an over-current, when the current through the TBU reaches the threshold current, MOSFET Q1 in combination with JFET Q2 stops conducting if the over current is a positive current from the input to the output or MOSFET Q3 in combination with JFET Q2 stops conducting if the over current is a positive current from the output to the input. In the case of positive current MOSFET Q4 has the same gate/source voltage as that generated across the JFET Q2. When JFET Q2 stops conducting the gate/source bias voltage stops MOSFET Q4 from conducting also, bringing avalanche diode D1 into the circuit. This condition is maintained until the voltage at the input of the TBU falls below a voltage equal to the voltage "V holding" of the avalanche diode D1 plus the avalanche voltage of diode D2. This action removes the gate/source bias from Q2, allowing the TBU to return to its initial conducting state without the requirement that the input voltage at input I/P returns to zero or near zero.

Figure 3:
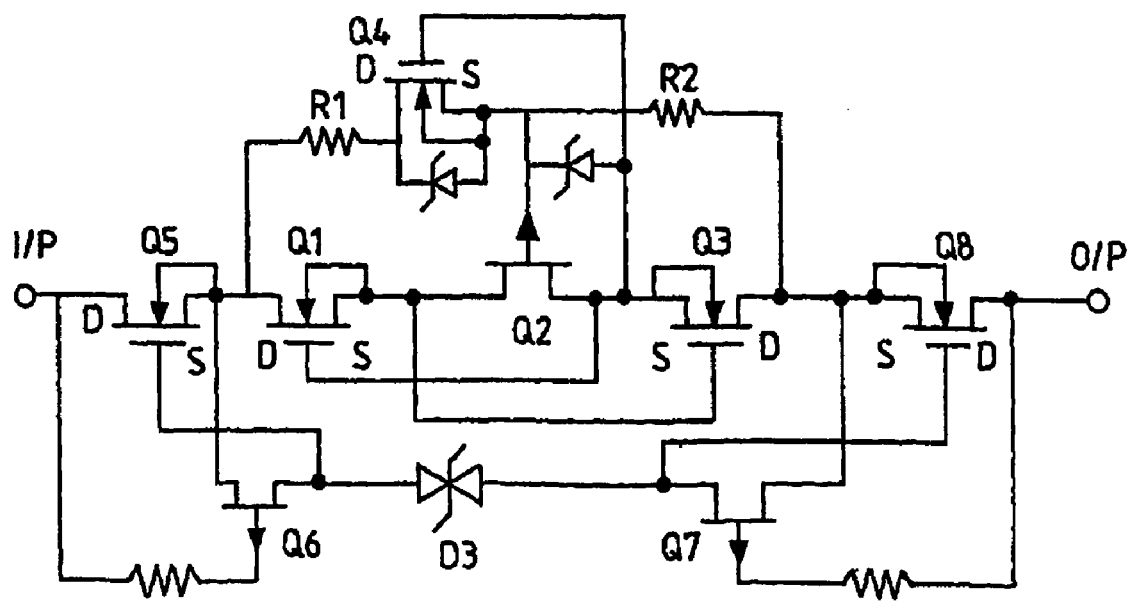
FIG. 3 is a circuit diagram of a protection device according to a third embodiment of the invention.

FIG. 3 of drawings shows a TBU circuit like that shown in FIG. 2. The components that the circuit of FIG. 3 has in common with FIG. 2 have been identified with like notation. The circuit of FIG. 3 provides a TBU capable of isolating a higher voltage than the TBU of FIG. 2.

The TBU of FIG. 3 has additional components connected between the input and output. After the TBU of circuit 3 is triggered as a result of threshold current being exceeded, transistors Q1, Q2 and Q3 provide the, normal circuit block function as described for the circuits of FIGS. 1 and 2. However, transistors Q5 and Q8 remain conducting if the voltage across the TBU (input voltage) is less than a minimum voltage V set by the avalanche voltage of back to back avalanche diode D3. When the input is greater than this minimum voltage, current begins to flow through pchannel depletion mode JFET Q6, back to back avalanche diodes D3 and depletion mode p channel JFET Q7. For positive current, the basic TBU combination of Q5 and Q6 trigger to an open circuit, blocking the additional voltage across Q5. For negative current the basic TBU combination of Q7 and Q8 trigger to an open circuit, blocking the additional voltage across Q8. The components associated with Q4 function as in FIG. 2 to ensure that the circuit may reset without the need for the input to return to zero or near zero voltage.

Figure 4:
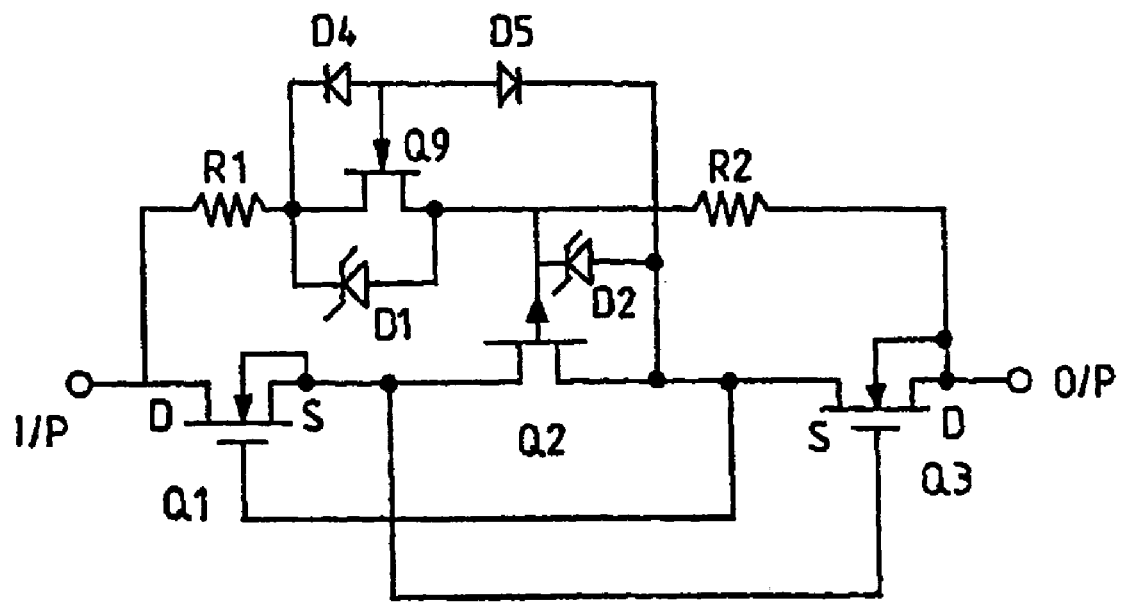
FIG. 4 is a circuit diagram of a protection device according to a fourth embodiment of the invention.

FIG. 4 shows an alternative TBU to that of FIG. 2. In FIG. 4, transistor Q4 of FIG. 2 has been replaced with a depletion mode n-channel JFET. Transistor Q9 requires the presence of commutating diodes D4 and D5 for it to function in the same manner as the circuit of FIG. 2.

The circuits of the invention employ depletion mode MOSFETS in the conduction path. As a consequence the need for commutating diodes required in the practical embodiments of U.S. Pat. No. 5,742,463 are not necessary in the embodiments of the present invention. In addition, the circuits of FIGS. 2, 3 and 4 according to the present invention are configured to ensure resetting so the conducting state may occur without the need for the input to the circuit to return to zero or near zero.

The circuits of the figures also function if the active components are swapped to the types other than those illustrated (N to P and P to N) and the diode directions are reversed.

With minor variations to the circuits to account for differing gate characteristics, other depletion mode FET devices such as JFETS and SITFETS may also be used to complete the same essential function.

The invention claimed is:

1. A protection device connectable between an input and a load or connectable in a circuit, the device having a variable resistance circuit block connectable between the input and the load or connectable in the circuit as a series element, the circuit block having a first depletion mode FET, a second depletion mode FET having a gate coupled to the first FET with a gate of the first FET being coupled to the second FET, and a third depletion mode field effect transistor (FET) between the first and second FETs and having its conductive channel in series with conductive paths of the first and second FETS and said third FET for generating a negligible resistance when the current through the circuit block is below a threshold level and for generating a relatively high resistance when the current through the circuit block reaches the threshold level, further including a holding circuit between the first FET and the third FET providing a holding voltage for resetting the third FET after the occurrence of a transient without the need for an input voltage to the device having to return to zero or near zero, wherein the holding circuit consists of a fourth depletion mode FET with its conductive channel connected between the gate of the third depletion mode FET and the input and having its gate coupled to a location between the second depletion mode FET and the third depletion mode FET.

2. The device of claim 1 wherein the gate of the fourth depletion mode FET is coupled to a location between the second depletion mode FET and the third depletion mode FET through a commutating diode, further including an avalanche diode connected across the conductive channel of the fourth depletion mode FETL and another commutating diode, with a first terminal of each said commutating diode connected to the gate of the fourth FET and the second terminal of one of the commutating diodes being connected to the drain of the fourth FET.

3. The device of claim 2 wherein the gate of the third FET is connected to the input through a current source in series with the holding circuit, and the gate of the third FET is connected to the output through a current source.

4. The device of claim 1 wherein the gate of the third FET is connected to the input through a current source in series with the holding circuit, and the gate of the third FET is connected to the output through a current source.

5. The device of claim 4 wherein the current sources are resistors.

6. The device of claim 1 including a first high voltage circuit block connected between the input and the first FET and a second high voltage circuit block connected between the output and the second FET.

7. A protection device connectable between an input and a load or connectable in a circuit, the device having a variable resistance circuit block connectable between the input and the load or connectable in the circuit as a series element, the circuit block having a first depletion mode FET, a second depletion mode FET having a gate coupled to the first FET with a gate of the first FET being coupled to the second FET, and a third depletion mode field effect transistor (FET) between the first and second FETs and having its conductive channel in series with conductive paths of the first and second FETS and said third FET for generating a negligible resistance when the current through the circuit block is below a threshold level and for generating a relatively high resistance when the current through the circuit block reaches the threshold level, further including a holding circuit between the first FET and the third FET providing a holding voltage for resetting the third FET after the occurrence of a transient without the need for an input voltage to the device having to return to zero or near zero, further including a first high voltage circuit block connected between the input and the first FET and a second high voltage circuit block connected between the output and the second FET, wherein the high voltage circuit blocks are coupled to each other by back to back connected avalanche diodes.

8. The device of claim 7 wherein each said high circuit voltage block consists of a fifth and a sixth depletion mode FET with their conductive channels in series with the conductive channel of the respective first and second FETS and a seventh and eighth depletion mode FET with the conductive channels connected between the source of the respective first or second FETS and one terminal of the back to back connected avalanche diodes and a current source between the gate of the respective sixth and seventh FETS and the input or the output.

9. The device of claim 8 wherein the fifth and sixth depletion mode FETS are MOSFETS and the seventh and eighth depletion mode FETS are JFETS.

10. The device of claim 8 wherein the current source is a resistor.

11. A current limiting protection device having first and second terminals, and a variable resistance circuit block connected between the first and second terminals, the circuit block having a first depletion mode FET and a second depletion mode FET, the first depletion mode FET having a gate coupled to the second FET, and the second depletion mode FET having a gate coupled to the first FET, a third depletion mode field effect transistor (FET) connected in series between the first and second depletion mode FETs and having its conductive channel in series with the conductive channels of the first and second depletion mode FETS, whereby the series connection of the first, second and third depletion mode FETs permits current to flow therethrough with low resistance when the first, second and third depletion mode FETs are conducting, wherein the gate of the third depletion mode FET is directly connected to the first and second terminals through respective current sources which are operative even when the voltage across the respective current source is near zero, whereby the gate of the third depletion mode FET is biased from the first and second terminals irrespective of the absolute voltage across the circuit block.

12. The device of claim 11 including a holding circuit within the current source between the first terminal and the third FET operatively providing a holding voltage function for resetting the third FET after the occurrence of a transient without the need for the voltage at the first terminal having to return to zero or near zero.

13. The device of claim 12 wherein the holding circuit comprises a fourth depletion mode FET having its gate coupled to a location between the second depletion mode FET and the third depletion mode FET.

14. The device of claim 13 including a first high voltage circuit block connected between the first terminal and the first FET, and a second high voltage circuit block connected between the second terminal and the second FET.

15. The device of claim 12 wherein the holding circuit includes a fourth depletion mode FET having its gate coupled to a location between the second depletion mode FET and the third depletion mode FET through a first commutating diode, an avalanche diode connected across the conductive channel of the fourth depletion mode FET, and a second commutating diode, with a first terminal of each said commutating diode being connected to the gate of the fourth FET and a second terminal of the second commutating diode being connected to the drain of the fourth FET.

16. The device of claim 11 wherein the current sources are resistors.

17. The device of claim 11 including a first high voltage circuit block connected between the first terminal and the first FET, and a second high voltage circuit block connected between the second terminal and the second FET.

18. The device of claim 17 wherein the high voltage circuit blocks are coupled to each other by back to back connected avalanche diodes.

19. The device of claim 18 wherein the first high voltage circuit block comprises a fifth depletion mode FET with its conductive channel in series with the conductive channel of the first FET, and a sixth depletion mode FET with its conductive channel connected between the first FET and one terminal of the back to back connected avalanche diodes, and a current source between the gate of the sixth FET and the first terminal, and wherein the second high voltage circuit block comprises an eighth depletion mode FET with its conductive channel in series with the conductive channel of the second FET, and a seventh depletion mode FET with its conductive channel connected between the second FET and the other terminal of the back to back connected avalanche diodes, and a current source between the gate of the seventh FET and the second terminal.

20. The device of claim 19 wherein the fifth and eighth depletion mode FETS are MOSFETS and the sixth and seventh depletion mode FETS are JFETS.

21. The device of claim 11 wherein the first and second depletion mode FETS are MOSFETS and the third depletion mode FET is a JFET.

* * * * *